(12) United States Patent
Chien et al.

(10) Patent No.: US 7,485,496 B2
(45) Date of Patent: Feb. 3, 2009

(54) SEMICONDUCTOR DEVICE PACKAGE WITH A HEAT SINK AND METHOD FOR FABRICATING THE SAME

(75) Inventors: Kun-Sheng Chien, Taichung (TW); Shih-Kuang Chiu, Taichung (TW); Han-Ping Pu, Taichung (TW); Cheng-Hsu Hsiao, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 47 days.

(21) Appl. No.: 11/648,443

(22) Filed: Dec. 29, 2006

(65) Prior Publication Data
US 2007/0235861 A1  Oct. 11, 2007

(30) Foreign Application Priority Data
Apr. 6, 2006  (TR)  ................ 95112137 A

(51) Int. Cl.
*H01L 21/00* (2006.01)
(52) U.S. Cl. ............... 438/122; 438/118; 257/707; 257/783
(58) Field of Classification Search ........... 257/706, 257/707, 782, 783, 778, 710; 438/108, 118, 438/122
See application file for complete search history.

(56) References Cited

U.S. PATENT DOCUMENTS

| | | | |
|---|---|---|---|
| 5,311,402 A | 5/1994 | Kobayashi et al. | |
| 5,396,403 A | 3/1995 | Patel | |
| 5,637,920 A | 6/1997 | Loo | |
| 5,650,918 A | 7/1997 | Suzuki et al. | |
| 5,931,222 A | 8/1999 | Toy et al. | |
| 6,011,304 A | 1/2000 | Mertol | |
| 2002/0006718 A1* | 1/2002 | Distefano | 438/617 |
| 2002/0105070 A1* | 8/2002 | Shibamoto et al. | 257/712 |
| 2002/0113306 A1* | 8/2002 | Kwon et al. | 257/691 |
| 2004/0164401 A1* | 8/2004 | Alcoe et al. | 257/704 |
| 2004/0251538 A1* | 12/2004 | Lin et al. | 257/712 |
| 2007/0190747 A1* | 8/2007 | Humpston et al. | 438/460 |
| 2008/0036077 A1* | 2/2008 | Wang | 257/717 |
| 2008/0054447 A1* | 3/2008 | Wu et al. | 257/704 |

* cited by examiner

*Primary Examiner*—S. V Clark
(74) *Attorney, Agent, or Firm*—Peter F. Corless; Steven M. Jensen; Edwards Angell Palmer & Dodge LLP

(57) ABSTRACT

A semiconductor package with a heat sink and a method for fabricating the same are proposed. A first adhesive of a low Young's modulus is disposed on a corner region of a heat sink mounting area of a substrate. A second adhesive of a high Young's modulus is disposed on the heat sink mounting area except the corner region. The heat sink is mounted on the heat sink mounting area and thereby secured in position to the substrate, by the first and second adhesives. The disposition of the first and second adhesives of different Young's moduli not only prevents detachment of the heat sink from the substrate, but also controls the flatness of the heat sink. The prevent invention does not affect the appearance of the semiconductor package and its ensuing assembly process.

18 Claims, 4 Drawing Sheets

US 7,485,496 B2

SEMICONDUCTOR DEVICE PACKAGE WITH A HEAT SINK AND METHOD FOR FABRICATING THE SAME

BACKGROUND OF THE INVENTION

1. Field of the Invention

The present invention relates to a semiconductor package and a fabrication method thereof, and more particularly, to a semiconductor package with a heat sink and a fabrication method thereof.

2. Description of Related Art

Generally, a semiconductor package such as a flip-chip ball grid array (FCBGA) package is provided with a heat sink so as to efficiently dissipate heat generated by a semiconductor chip during operation. As disclosed by U.S. Pat. Nos. 5,311,402, 5,396,403, 5,931,222, 5,637,920, 5,650,918 and 6,011,304, such a heat sink can be attached to a substrate mounted with the semiconductor chip by adhesive or solder. With the heat sink contacting the semiconductor chip, heat generated by the semiconductor chip during operation can be efficiently dissipated. Generally, the surface area of the heat sink is greater than that of the semiconductor chip such that the semiconductor chip can be covered by the heat sink completely.

FIG. 1 shows a conventional flip-chip ball grid array semiconductor package with a heat sink. As shown in FIG. 1, a semiconductor chip 11 is mounted on a substrate 10 through a plurality of conductive bumps 17, and a heat sink 15 comprises a flat portion 150 and a supporting portion 151 extending from the flat portion 150. The heat sink 15 is mounted on the substrate 10 via the supporting portion 151 and by an adhesive 14. The semiconductor chip 11 is received in a receiving space defined by the flat portion 150 and the supporting portion 151 of the heat sink 15 in a manner that a non-active surface of the semiconductor chip 11 is adhered to the flat portion 150 of the heat sink 15 by a heat conductive adhesive layer 16. Therefore, heat generated by the semiconductor chip 11 during operation can be dissipated efficiently by the heat sink 15.

However, owing to big differences between coefficients of thermal expansion (CTE) of the heat sink, the substrate and the semiconductor chip, thermal stress and thermal deformation generated during a thermal cycle process of the semiconductor chip package can easily lead to warpage of the package, and even lead to detachment of the heat sink from the substrate and crack of the conductive bumps, thereby adversely affecting the quality of electrical connection between the semiconductor chip and the substrate. Particularly, according to an equation $\delta = \alpha * L * \Delta t$, wherein, $\delta$ represents total deformation, $\alpha$ represents coefficient of thermal expansion, L represents length, and $\Delta t$ represents change in temperature, both the thermal stress and the thermal deformation are directly proportional to length. Thus, maximum thermal stress and thermal deformation usually occur to a corner of the heat sink 15.

To decrease the thermal stress arising from different coefficients of thermal expansion, an adhesive of a low Young's modulus, such as a silicone-base adhesive, is usually disposed between the heat sink 15 and the substrate 10 so as to absorb the heat stress. However, such an adhesive of a low Young's modulus fails to provide sufficient supporting strength to the heat sink 15. Instead, such an adhesive often leads to unevenness of the heat sink 15 and even affects the appearance of the semiconductor package and an ensuing assembly process. On the other hand, although an adhesive of a high Young's modulus provides sufficient supporting strength, such problems as detachment of the heat sink 15 from the substrate 10 and crack of conductive bumps 17 may still occur because of the thermal stress. Therefore, it often needs to take a large amount of time to find suitable adhesives for mounting heat sinks and chips of different sizes on a substrate, which thus increases fabrication time and fabrication cost.

Accordingly, there exists a strong need in the art for a semiconductor package with a heat sink and a fabrication method thereof to solve the drawbacks of the above-described conventional technology.

SUMMARY OF THE INVENTION

Accordingly, it is an objective of the present invention to provide a semiconductor package with a heat sink and a fabrication method thereof, so as to prevent detachment of the heat sink.

Another objective of the present invention is to provide a semiconductor package with a heat sink and a fabrication method thereof, such that the heat sink is efficiently supported.

Yet another objective of the present invention is to provide a semiconductor package with a heat sink and a fabrication method thereof, so as to control the flatness of the heat sink without affecting the appearance of the semiconductor package and an ensuing assembly process.

A further objective of the present invention is to provide a semiconductor package with a heat sink and a fabrication method thereof, which can avoid crack of conductive bumps used in a flip-chip process.

Still a further objective of the present invention is to provide a semiconductor package with a heat sink and a fabrication method thereof, so as to reduce the time taken to find suitable adhesives for mounting heat sinks and chips of different sizes on a substrate and thereby reducing fabrication costs.

In order to attain the objectives mentioned above and the others, a method for fabricating a semiconductor package with a heat sink is disclosed according to the present invention. The method comprises the steps of: providing a substrate having a heat sink mounting area; mounting and electrically connecting a semiconductor chip to the substrate; disposing a first adhesive on a corner region of the heat sink mounting area and a second adhesive on the heat sink mounting area except the corner region, the second adhesive having a Young's modulus different from that of the first adhesive; and mounting a heat sink on the heat sink mounting area of the substrate by the first and second adhesives.

The present invention further discloses a semiconductor package, which comprises a substrate with a heat sink mounting area, a semiconductor chip mounted on the substrate, a first adhesive disposed on a corner region of the heat sink mounting area, a second adhesive disposed on the heat sink mounting area except the corner region, and a heat sink mounted on the heat sink mounting area of the substrate by the first and second adhesives.

The Young's modulus of the first adhesive is less than that of the second adhesive. The heat sink comprises a flat portion and a supporting portion extending downward from a periphery of the flat portion. The semiconductor chip is mounted on the substrate and covered by the heat sink.

In the present invention, the first adhesive of a low Young's modulus can absorb the thermal stress of the heat sink so as to reduce the warpage resulting from the thermal stress of the heat sink. Therefore, such problems as cracking of conductive bumps electrically connecting the semiconductor chip and the substrate and detachment of the heat sink from the substrate can be solved. Meanwhile, the second adhesive of a high Young's modulus can support the heat sink and control the flatness of the heat sink without affecting appearance of the semiconductor package and an ensuing assembly process.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be devised without departing from the spirit of the present invention.

Referring to FIGS. 2A to 2D, a semiconductor package with a heat sink and a fabrication method thereof according to the present invention are shown.

Figure 1:
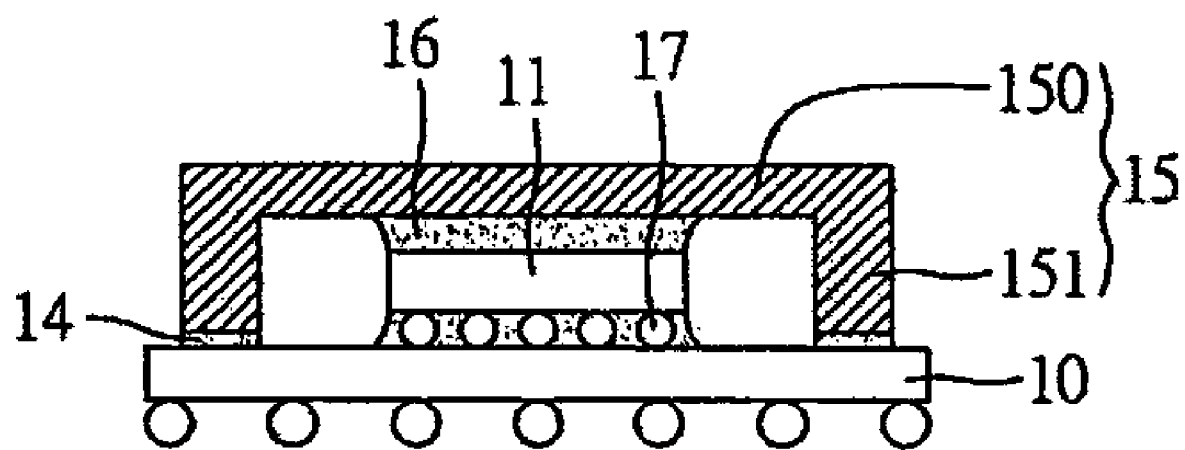
FIG. 1 (PRIOR ART) is a cross-sectional view showing a conventional semiconductor package with a heat sink.
Figure 2A:
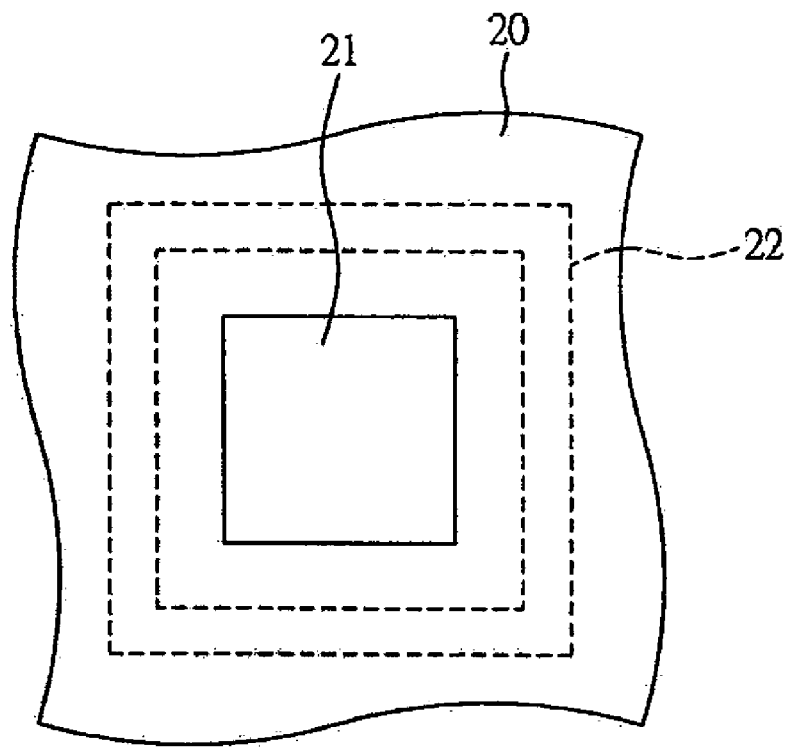
FIGS. 2A to 2D are schematic views showing a semiconductor package with a heat sink and a fabrication method thereof according to the present invention.

Referring to FIG. 2A, a substrate 20 having a heat sink mounting area 22 (marked with dash lines) is provided. A semiconductor chip 21 is flip-chip mounted on the substrate 20 and electrically connected to the substrate 20 via conductive bumps.

Figure 2B:
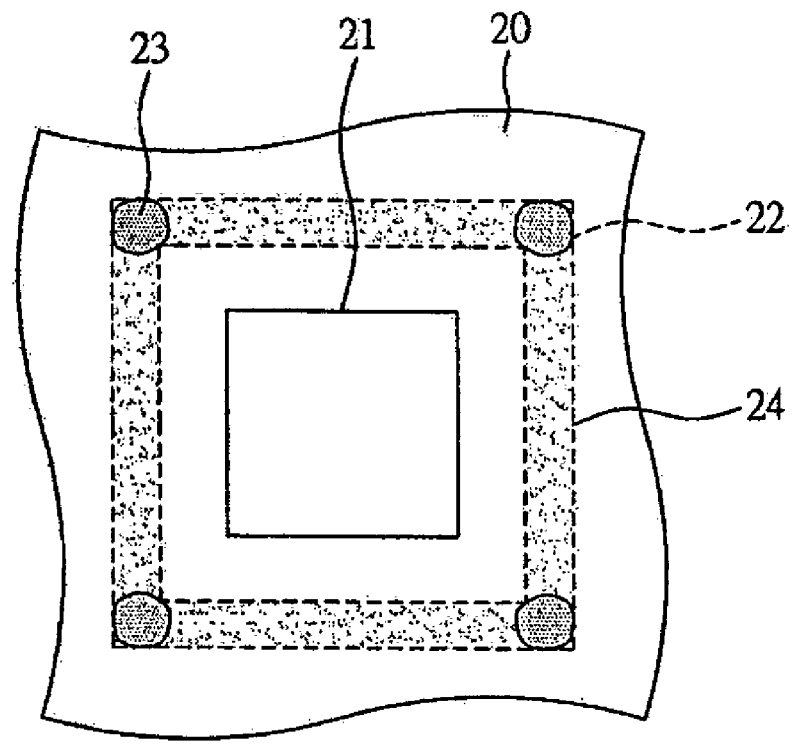

Referring to FIG. 2B, a first adhesive 23 is disposed on a corner region of the heat sink mounting area 22 of the substrate 20. The first adhesive 23 is made of a material of a low Young's modulus, such as silicone, with a glass transition temperature (Tg) below 80° C. or a Young's modulus less than 2000 Mpa at room temperature (25° C.). Further, a second adhesive 24 is disposed on the heat sink mounting area 22 except the corner region. In the present embodiment, the heat sink mounting area 22 has a portion not disposed with the first adhesive 23 but completely disposed with the second adhesive 24. The second adhesive 24 has a Young's modulus larger than that of the first adhesive 23. The second adhesive 24 is made of a material of a high Young's modulus, with a glass transition temperature (Tg) above 80° C. or a Young's modulus greater than 2000 Mpa at room temperature (25° C.).

Figure 2C:
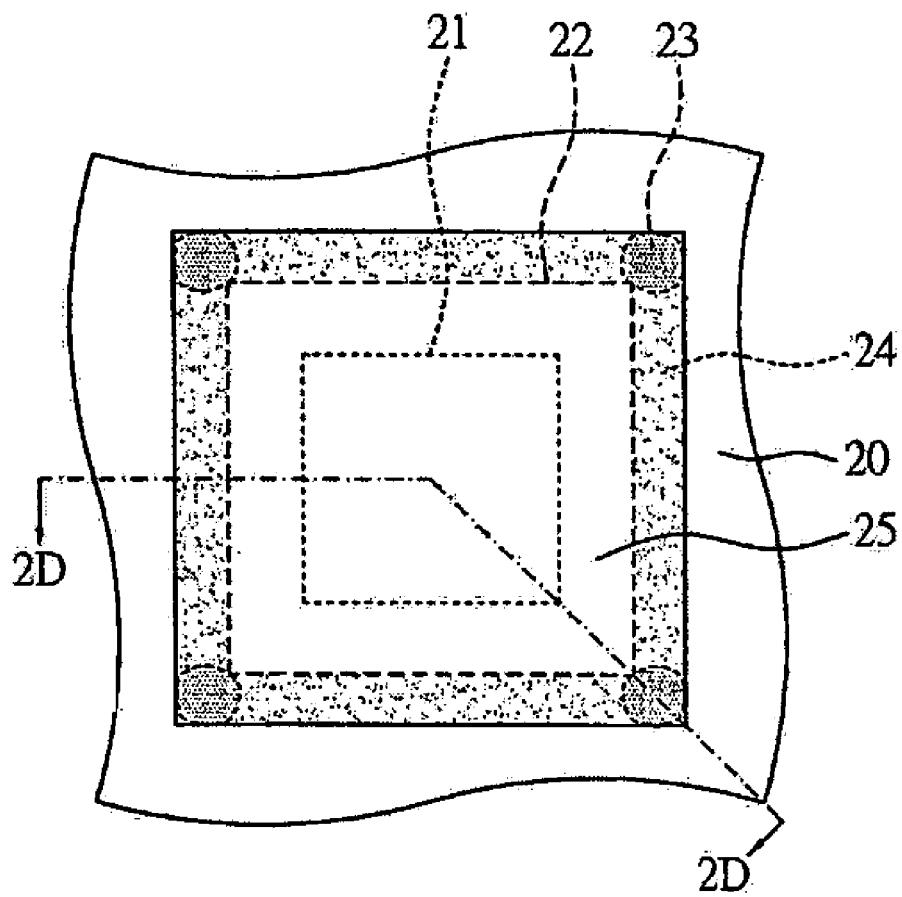
Figure 2D:
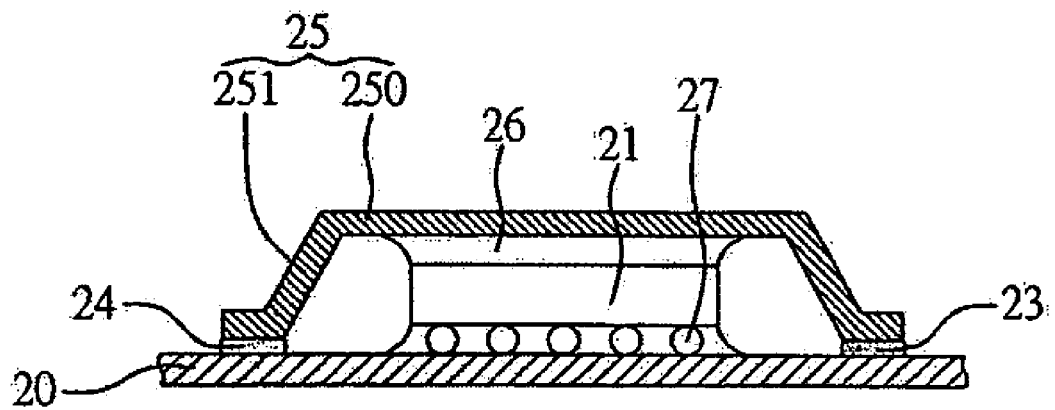

FIGS. 2C and 2D are cross-sectional views showing a semiconductor package with a heat sink. FIG. 2D is a cross-sectional view taken along the section line 2D-2D of FIG. 2C. As shown in FIGS. 2C and 2D, a heat sink 25 is mounted on the heat sink mounting area 22 of the substrate 20 by the first adhesive 23 and the second adhesive 24 and covers the semiconductor chip 21. Therefore, heat generated by the semiconductor chip 21 during operation can be efficiently dissipated to the outside through the heat sink 25.

The heat sink 25 comprises a flat portion 250 and a supporting portion 251 extending downward from a periphery of the flat portion 250. The heat sink 25 is secured in position to the substrate 20 via the supporting portion 251 by means of the first adhesive 23 and the second adhesive 24. The flat portion 250 of the heat sink 25 is attached to the semiconductor chip 21 via a heat conductive adhesive layer 26. The semiconductor chip 21, which is mounted and electrically connected to the substrate 20 by means of conductive bumps 27, is received in a receiving space defined by the flat portion 250 and the supporting portion 251. Therefore, heat generated by the semiconductor chip 21 during operation can be efficiently dissipated by the heat sink 25.

In the present invention, the first adhesive 23 is made of a material of a low Young's modulus and thereby can absorb the stress of the heat sink 25 so as to reduce the warpage caused to the semiconductor package by the stress of the heat sink 25. The second adhesive 24 is made of a material of a high Young's modulus and thereby can effectively support the heat sink 25 and control the flatness of the heat sink 25 such that the appearance of the semiconductor package and any ensuing assembly process are not affected.

In addition to the above fabrication method, the present invention discloses a semiconductor package with a heat sink. The semiconductor package comprises a substrate 20 with a heat sink mounting area 22, a semiconductor chip 21 mounted on the substrate 20, a first adhesive 23 disposed on a corner region of the heat sink mounting area 22, a second adhesive 24 disposed on a portion of the heat sink mounting area 22 wherein the portion of the heat sink mounting area 22 is not disposed with the first adhesive 23, and a heat sink 25 mounted on the heat sink mounting area 22 of the substrate 20 by the first and second adhesives 23 and 24.

Figure 3:
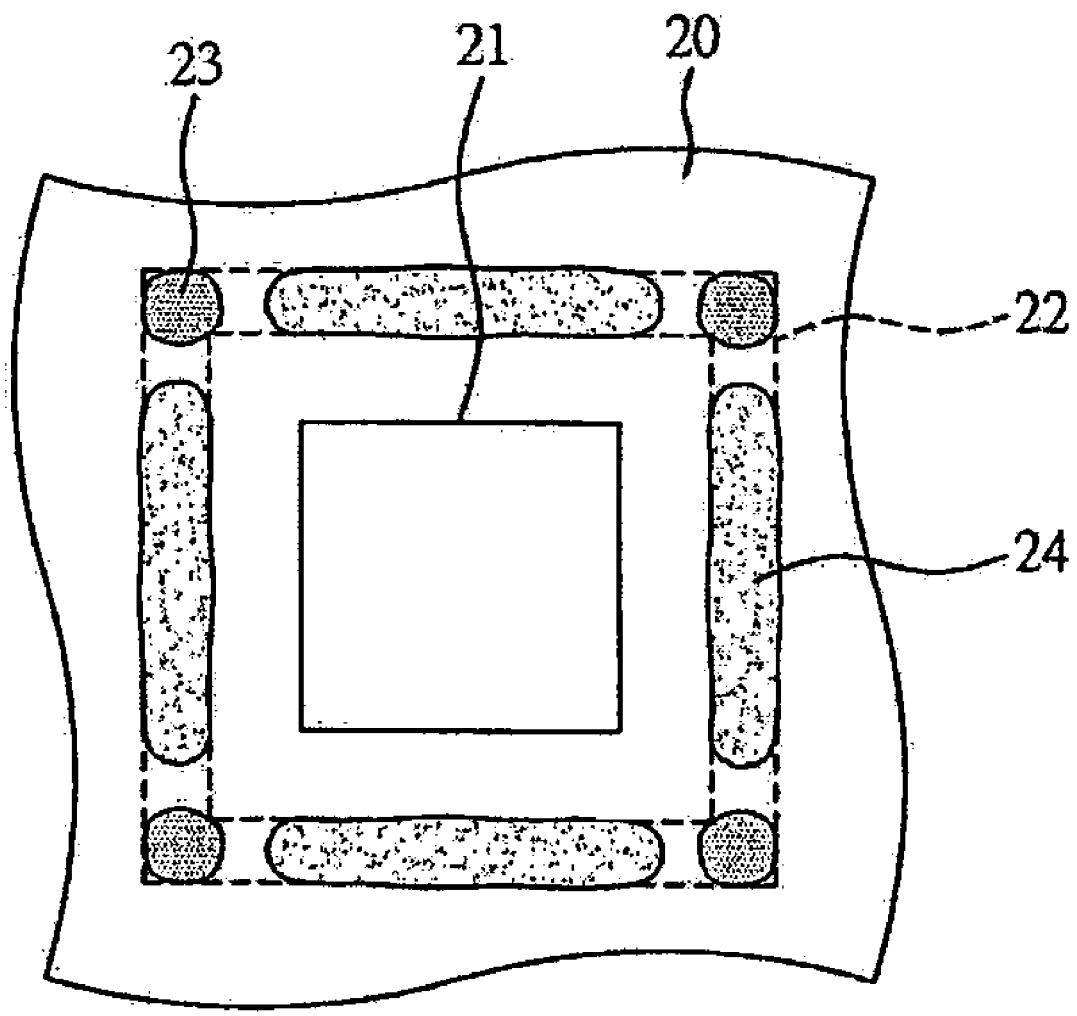
FIG. 3 is a schematic view showing another embodiment of a semiconductor package with a heat sink according to the present invention.

Referring to FIG. 3, which is a schematic view showing another embodiment of a semiconductor package with a heat sink according to the present invention. The main differences between the semiconductor package of the present embodiment and that of the above embodiment are as follows. The first adhesive 23 made of a material of a low Young's modulus is disposed on a corner region of the heat sink mounting area 22 of the substrate 20. The second adhesive 24 is disposed on the heat sink mounting area 22 except the corner region. The second adhesive 24 is only partially disposed on the heat sink mounting area 22 that is not disposed with the first adhesive 23. The heat sink mounting area 22 has a portion not disposed with the first adhesive 23 but partially disposed with the second adhesive 24. The second adhesive 24 has a Young's modulus greater than that of the first adhesive 23, so as to further reduce the effect of stress on the warpage of the semiconductor package.

According to the present invention, a substrate having a heat sink mounting area is provided first. Then, a first adhesive of a low Young's modulus is disposed on a corner region of the heat sink mounting area and a second adhesive of a high Young's modulus on the heat sink mounting area except the corner region such that a heat sink can be mounted on the heat sink mounting area of the substrate by means of the first and second adhesives. Therein, the first adhesive of a low Young's modulus can absorb the stress of the heat sink so as to reduce warpage of the semiconductor package arising from the stress of the heat sink. Therefore, cracking of conductive bumps electrically connecting the semiconductor chip and the substrate and detachment of the heat sink from the substrate can be avoided. Besides, the second adhesive of a high Young's modulus can support the heat sink and control the flatness of the heat sink without affecting the appearance of the semiconductor package and an ensuing assembly process.

The foregoing embodiments are only illustrative of the features and functions of the present invention but are not intended to restrict the scope of the present invention. It is apparent to those skilled in the art that all modifications and variations made in the foregoing embodiments according to the spirit and principle in the disclosure of the present invention should fall within the scope of the appended claims.

What is claimed is:

1. A method for fabricating a semiconductor package with a heat sink, the method comprising the steps of:
providing a substrate having a heat sink mounting area;
mounting and electrically connecting a semiconductor chip to the substrate;
disposing a first adhesive on a corner region of the heat sink mounting area and a second adhesive on the heat sink mounting area except the corner region, the second adhesive having a Young's modulus greater than that of the first adhesive; and
mounting a heat sink on the heat sink mounting area of the substrate by the first and second adhesives.

2. The method of claim 1, wherein the first adhesive has one of a glass transition temperature below 80° C. and a Young's modulus less than 2000 Mpa at room temperature.

3. The method of claim 1, wherein the first adhesive is made of silicone.

4. The method of claim 1, wherein the second adhesive has one of a glass transition temperature above 80° C. and a Young's modulus greater than 2000 Mpa at room temperature.

5. The method of claim 1, wherein the semiconductor chip is electrically connected to the substrate by a flip-chip process.

6. The method of claim 1, wherein the heat sink comprises a flat portion and a supporting portion extending downward from a periphery of the flat portion, the heat sink being secured in position to the substrate through the supporting portion by means of the first and second adhesives.

7. The method of claim 6, wherein the flat portion of the heat sink is attached to the semiconductor chip mounted on the substrate via a heat conductive adhesive layer.

8. The method of claim 1, wherein the heat sink mounting area has a portion not disposed with the first adhesive but completely disposed with the second adhesive.

9. The method of claim 1, wherein the heat sink mounting area has a portion not disposed with the first adhesive but partially disposed with the second adhesive.

10. A semiconductor package with a heat sink, comprising:
a substrate with a heat sink mounting area;
a semiconductor chip mounted on the substrate;
a first adhesive disposed on a corner region of the heat sink mounting area;
a second adhesive disposed on a portion of the heat sink mounting area and having a Young's modulus greater than that of the first adhesive, wherein the portion of the heat sink mounting area is not disposed with the first adhesive; and
a heat sink mounted on the heat sink mounting area of the substrate by the first and second adhesives.

11. The semiconductor package with a heat sink of claim 10, wherein the first adhesive has one of a glass transition temperature below 80° C. and a Young's modulus less than 2000 Mpa at room temperature.

12. The semiconductor package with a heat sink of claim 10, wherein the first adhesive is made of silicone.

13. The semiconductor package with a heat sink of claim 10, wherein the second adhesive has one of a glass transition temperature above 80° C. and a Young's modulus greater than 2000 Mpa at room temperature.

14. The semiconductor package with a heat sink of claim 10, wherein the semiconductor chip is electrically connected to the substrate by a flip-chip process.

15. The semiconductor package with a heat sink of claim 10, wherein the heat sink comprises a flat portion and a supporting portion extending downward from a periphery of the flat portion, the heat sink being secured in position to the substrate through the supporting portion and by the first and second adhesives.

16. The semiconductor package with a heat sink of claim 15, wherein the flat portion of the heat sink is attached to the semiconductor chip mounted on the substrate via a heat conductive adhesive layer.

17. The semiconductor package with a heat sink of claim 10, wherein the heat sink mounting area has a portion not disposed with the first adhesive but completely disposed with the second adhesive.

18. The semiconductor package with a heat sink of claim 10, wherein the heat sink mounting area has a portion not disposed with the first adhesive but partially disposed with the second adhesive.

* * * * *